United States Patent [19]

Leeb et al.

[11] Patent Number: 5,483,153
[45] Date of Patent: Jan. 9, 1996

[54] TRANSIENT EVENT DETECTOR FOR USE IN NONINTRUSIVE LOAD MONITORING SYSTEMS

[75] Inventors: Steven B. Leeb, Belmont; James L. Kirtley, Jr., Brookline, both of Mass.

[73] Assignee: Massachusetts Institute of Technology, Cambridge, Mass.

[21] Appl. No.: 217,488

[22] Filed: Mar. 24, 1994

[51] Int. Cl.⁶ ................................................. G01R 21/06
[52] U.S. Cl. ...................... 324/76.12; 324/102; 324/522; 340/657; 364/483; 364/464.04
[58] Field of Search ............................. 364/464.04, 483, 364/492, 550, 551.01; 324/102, 512, 522, 525, 537, 555, 76.12, 76.13, 76.34; 340/635, 657, 660, 664

[56] References Cited

U.S. PATENT DOCUMENTS

| 4,672,555 | 6/1987 | Hart et al. | 364/483 |
| 4,694,402 | 9/1987 | McEachern et al. | 324/102 |
| 4,858,141 | 8/1989 | Hart et al. | 364/483 |
| 4,979,122 | 12/1990 | Davis et al. | 364/483 |
| 5,182,717 | 1/1993 | Luciani et al. | 364/481 |
| 5,196,982 | 3/1993 | Landsberg et al. | 361/93 |
| 5,301,122 | 4/1994 | Halpern | 364/483 |
| 5,337,013 | 8/1994 | Langer et al. | 324/537 |

*Primary Examiner*—Kenneth A. Wieder
*Assistant Examiner*—Christopher M. Tobin
*Attorney, Agent, or Firm*—Samuels, Gauthier & Stevens

[57] ABSTRACT

The present invention provides a transient event detector for use in a nonintrusive electrical load monitoring system at a monitored site having at least one electrical load. The transient event detector includes a data acquisition portion for acquiring and storing start-up power transient pattern data associated with each electrical load being monitored; a monitor for continuously monitoring total power load pattern data at the site; and a processor for correlating the transient pattern data to the total power load pattern data in order to identify each electrical load.

34 Claims, 8 Drawing Sheets

TRANSIENT EVENT DETECTOR FOR USE IN NONINTRUSIVE LOAD MONITORING SYSTEMS

BACKGROUND OF THE INVENTION

The invention relates to a multiscale transient event detector for use in nonintrusive load monitoring.

Electric utilities and commercial facilities want to develop detailed electric power consumption profiles of their customers to aid in leveling peak loads and in planning future capacity. Conventional metering of individual appliances is costly and inconvenient to the consumer. These costs increase swiftly as data requirements become increasingly complex. The high cost of equipment continues to limit the amount of usage data utilities can collect. Additional drawbacks of the equipment now available for collection of end-use load survey data range from their cost, reliability, and flexibility to intrusion into the customer's activities and premises.

To deal with these concerns, utilities have sought a way of determining the operating history of an electrical load from measurements made solely at the utility service entry of a building. This problem is actually quite tractable under certain conditions. As a result nonintrusive load monitoring systems were developed. Nonintrusive load monitors (NILM) are intended to determine the operating schedule of the major electrical loads in a building from measurements made at the utility service entry. Conventional load monitoring schemes require separate metering equipment or connections for every load of interest. The feasibility of the nonintrusive monitoring approach for residential purposes has been demonstrated. However, fundamental limitations in the design of the residential NILM hinder its ability to operate in a commercial or industrial building, where appliances turn on and off frequently and substantial efforts, e.g., power factor correction, are made to homogenize the steady state behavior of different loads.

The advantages of nonintrusive load monitoring over conventional load monitoring include ease of installation at the monitoring site, since the nonintrusive load monitor (NILM) requires a single set of electrical ties. In addition, NILM offers simplification of data collection, since the NILM automatically determines the electrical nature of the simple, "two-state" appliances in a target building without the need for a load survey or inspection. Furthermore, NILM enhances facilitation of data analysis since, by definition, the NILM collects and potentially analyzes all data at a central location.

The NILM is more than a convenient and economical means of acquiring energy usage data. It is, for example, a potentially important platform for power quality monitoring. Utilities, manufacturers, and consumers are becoming increasingly aware of "power pollution". Many loads, such as computers and other office equipment, lighting fixtures, and adjustable speed drive systems found in modern air handling equipment, may contain solid state switch mode power converters that could draw distorted, nonsinusoidal input current waveforms. These harmonic currents create harmonic voltages as they flow through impedances in the utility's transmission system, degrading the quality of the delivered voltage waveform. Power pollution has become more than an academic concern as consumers increasingly turn to power electronic solutions to increase efficiency.

Additional monitoring capability for harmonic current content would generally be cheaper and easier to install at a service entry location than on every load of interest. The NILM could track down power quality offenders by correlating the introduction of undesired harmonics with the operation of certain loads at a target site. Conventional implementations of the residential NILM track the operating schedules of the loads at a target site by looking for changes in steady state levels of real and reactive power. While informative in the residential setting, changes in steady state power levels are less revealing in commercial or industrial environments, where substantial efforts, e.g., power factor correction and load balancing, are made to homogenize the steady state behavior of different loads.

Fortunately, the transient behavior of many important load classes is sufficiently distinct to serve as a reliable indicator of load type. The present invention presents a transient event detector and process that can be used to identify observed transient waveforms even when multiple transients overlap. The detector and process are suitable for incorporation into an advanced NILM which would be capable of monitoring demanding commercial and industrial sites.

SUMMARY OF THE INVENTION

Accordingly, the present invention provides a transient event detector for use in a nonintrusive electrical load monitoring system at a monitored site having at least one electrical load. The transient event detector includes data acquisition means for acquiring and storing start-up power transient pattern data associated with each electrical load being monitored; monitoring means for continuously monitoring total power load pattern data at the site; and processing means for correlating the transient pattern data to the total power load pattern data in order to identify each electrical load.

DETAILED DESCRIPTION OF THE ILLUSTRATED EMBODIMENTS

The transient behavior of many important load classes is sufficiently distinctive to serve as a reliable indicator of load type. In addition, it will be appreciated that for many groups of loads, a single prototype transient shape can, with appropriate scaling in amplitude and duration, represent the transient behavior of all of the loads in a group. In fact, the transient behavior of a typical electrical load is intimately related to the physical task that the load performs. A load survey conducted by the Applicant indicates that nonlinearities in the constitutive relationships of the elements that comprise a load model, or in the state equations that describe a load, or both, tend to create interesting and repeatably observable turn-on transient profiles suitable for identifying specific load classes. The turn-on transients associated with a fluorescent lamp and an induction motor, for example, are distinct because the physical tasks of igniting an illuminating arc and accelerating a rotor are fundamentally different. Transient profiles tend not to be eliminated even in loads which employ active waveshaping or power factor correction. Load classes that perform physically different tasks are likely to be distinguishable based on their transient behavior.

Figure 1:
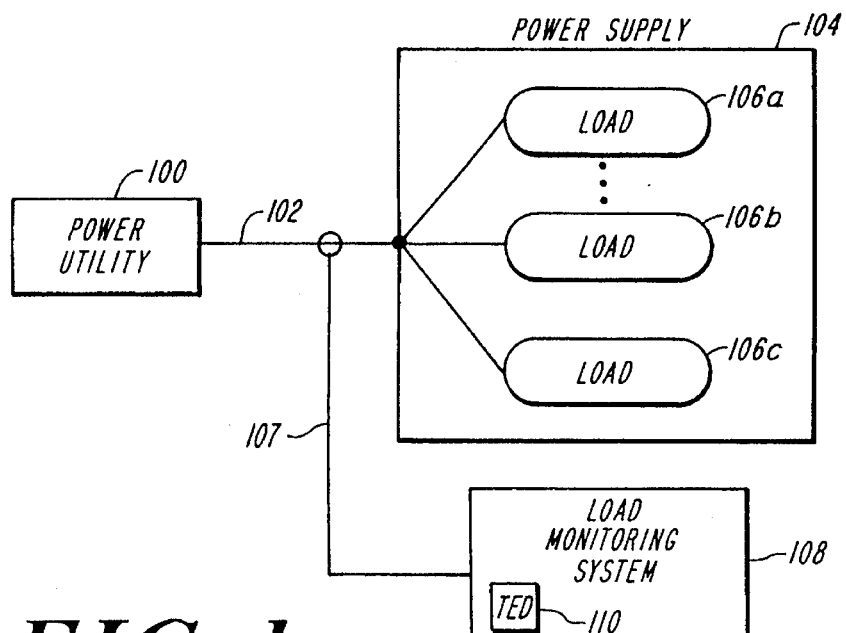
FIG. 1 shows a block diagram of a nonintrusive load monitoring system utilizing a transient event detector in accordance with the present invention.

Accordingly, with reference to FIG. 1, a block diagram of a nonintrusive load monitoring system (NILM) 108 utilizing the transient event detector 110 in accordance with the present invention is shown. In an exemplary setup, a moderate to large size commercial or industrial power facility 104, three phase electrical service will be provided from a power utility 100 via a power line 102. The power facility will include various electrical loads 106a–106c.

Figure 9:
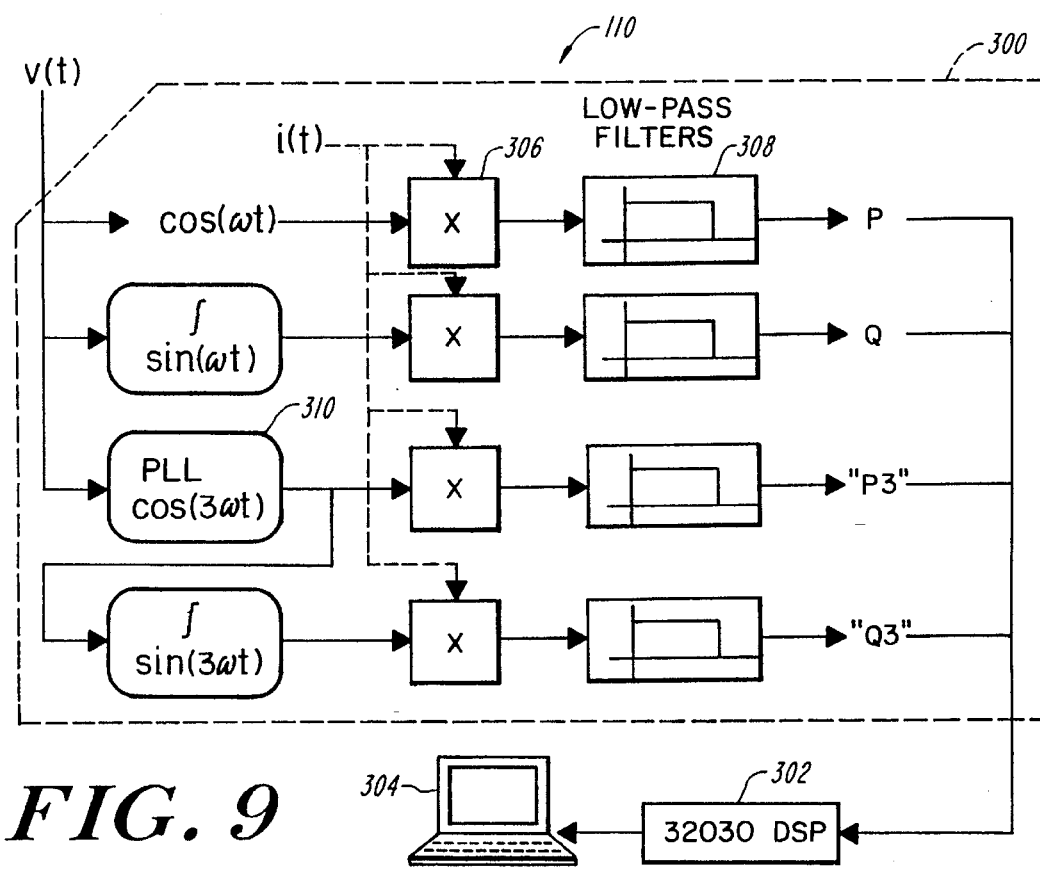
FIG. 9 shows a block diagram of an exemplary embodiment of the multiscale transient event detector in accordance with the present invention.

In an exemplary embodiment as illustrated in FIG. 9, the transient event detector 110 includes an analog preprocessor 300, a digital signal processor (DSP) 302, and a conventional computer processing unit 304 such as a PC. The DSP and processing unit, for example, are a Texas Instruments TMS320C30 digital signal processing card installed in an Intel 80486-based PC. The DSP card provides analog-to-digital conversion circuitry and real-time, floating point computational capabilities. The PC provides a convenient front-end with a graphical video display and inexpensive mass storage. The analog preprocessor contains current and voltage sensors configured to monitor the three phase currents and voltages on a 120 volt RMS AC line-to-neutral, three phase service. It also contains circuitry that computes estimates of the envelopes of real and reactive power, and also third harmonic content in the current waveform, on each of the three phases.

At the service entry of the power facility, the NILM 108 samples the utility voltage waveform and also the aggregate current waveform drawn by the loads on each of the three phases in all or part of the facility via sensor line 107. However, direct examination of the current waveform or a closely related waveform like that of instantaneous power (i.e., the product of the voltage and current) fails to accentuate important features for pattern recognition. It is very important to isolate key features from near constant frequency, "carrier wave" type signals like 60 Hertz input current or 120 Hertz instantaneous power, so that slight errors in matching carrier frequency variation with a template do not dominate the results of a recognition system searching for a modulating envelope.

One approach to eliminating carrier frequency artifacts from input data is to work with short time estimates that average over at least one carrier frequency period. For example, an estimate of the envelope of real power can be computed by first computing the instantaneous power by multiplying or mixing the input current with the input voltage, and then filtering the product with a low-pass filter whose cutoff frequency occurs significantly below the carrier frequency, 120 Hertz in this case. Only the slow envelope or estimate of the time average of instantaneous power, i.e., real power, will remain. Other relevant quantities may be computed in a similar manner. An estimate of the envelope of reactive power may be found by mixing the current with a sinusoid that lags 90 degrees out of phase with respect to the input voltage, and then low-pass filtering the product. Approximate envelopes of higher harmonic content in the current waveform may also be found, by mixing the current with a sinusoid at a frequency above the fundamental frequency of 60 Hertz and then low-pass filtering.

Searching for complete transients is an undesirable approach because it limits the tolerable rate of event generation. No two transient events could overlap significantly if each transient were to be identified correctly. Instead, the transient event detector in accordance with the present invention searches for a time pattern of segments with significant variation, or "v-sections", rather than searching for a transient shape in its entirety.

Figure 2:
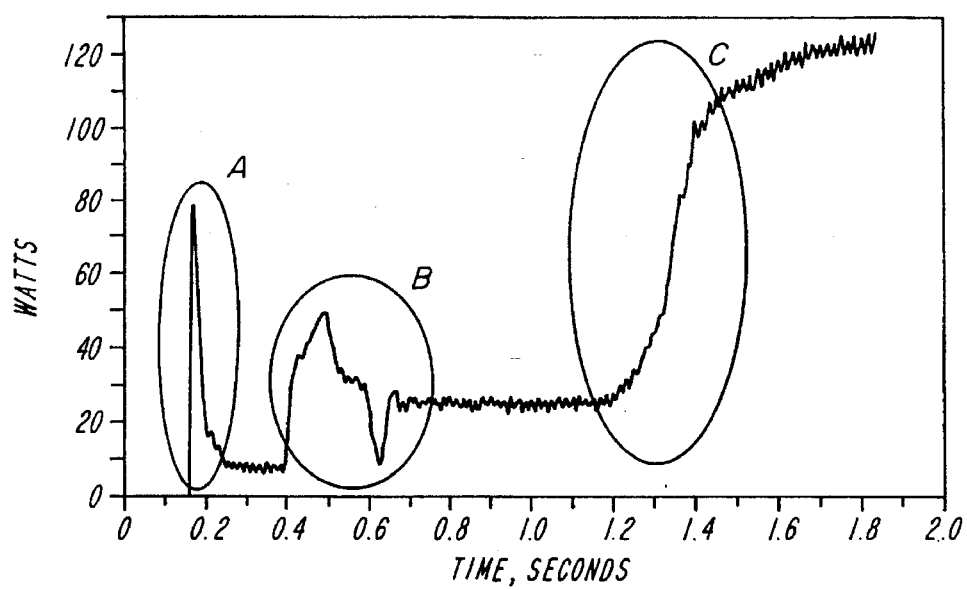
FIG. 2 shows a trace of the envelope of real power during the turn-on transient of a rapid start fluorescent lamp bank.
Figure 3:
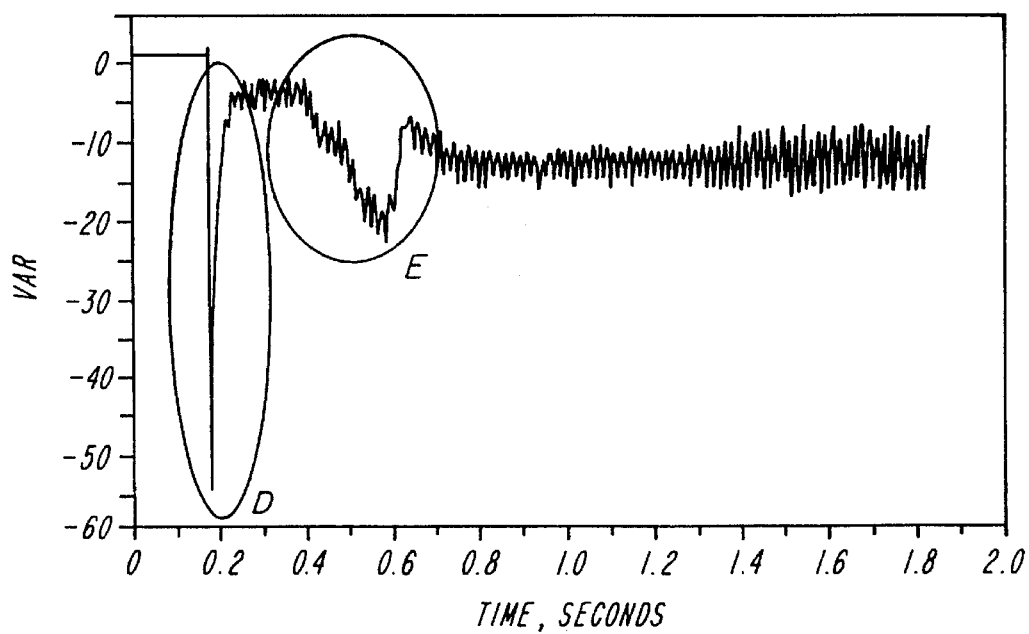
FIG. 3 shows a trace of the envelope of reactive power during the turn-on transient of a rapid start fluorescent lamp bank.

For example, during a training phase, either before installation or on-site, the NILM 108 utilizes a waveform segmentation technique to segment a finest scale transient that represents a class of loads. This segmentation process delineates a set of v-sections that will represent a particular transient shape in each of the input data streams. Examples are shown in FIGS. 2 and 3. The trace in FIG. 2 shows the envelope of real power during the turn-on transient of a rapid start fluorescent lamp bank. The trace in FIG. 3 shows the envelope of reactive power during the turn-on transient. The locations of the v-sections in the two waveforms are approximately indicated by the five ellipses labeled A–E in the figures.

Figure 4:
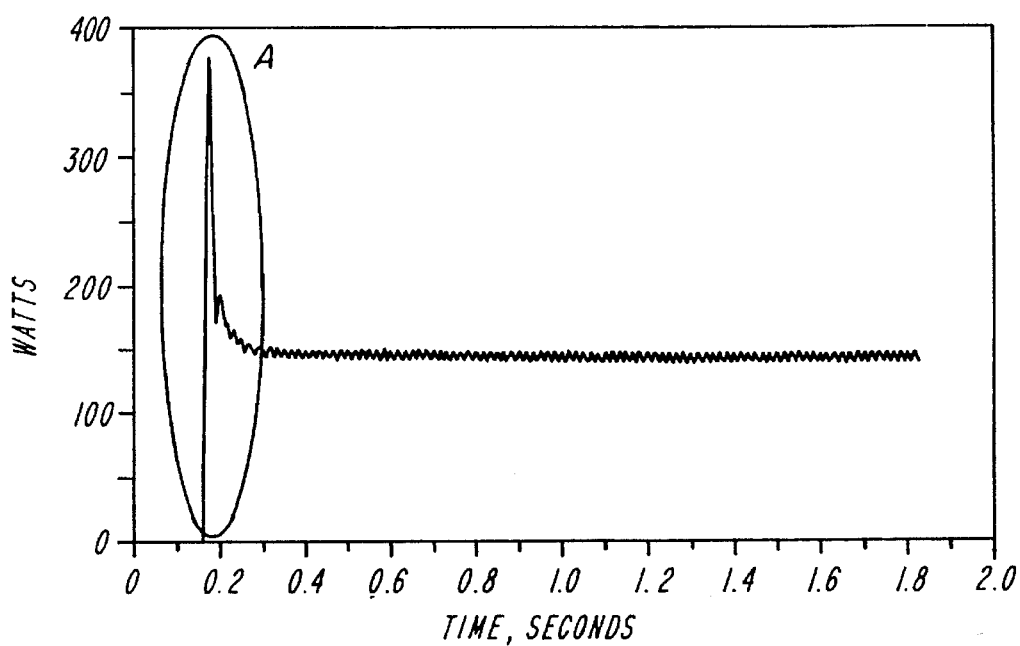
FIG. 4 shows the measured envelope of real power transients during turn-on for an instant start fluorescent lamp bank.
Figure 5:
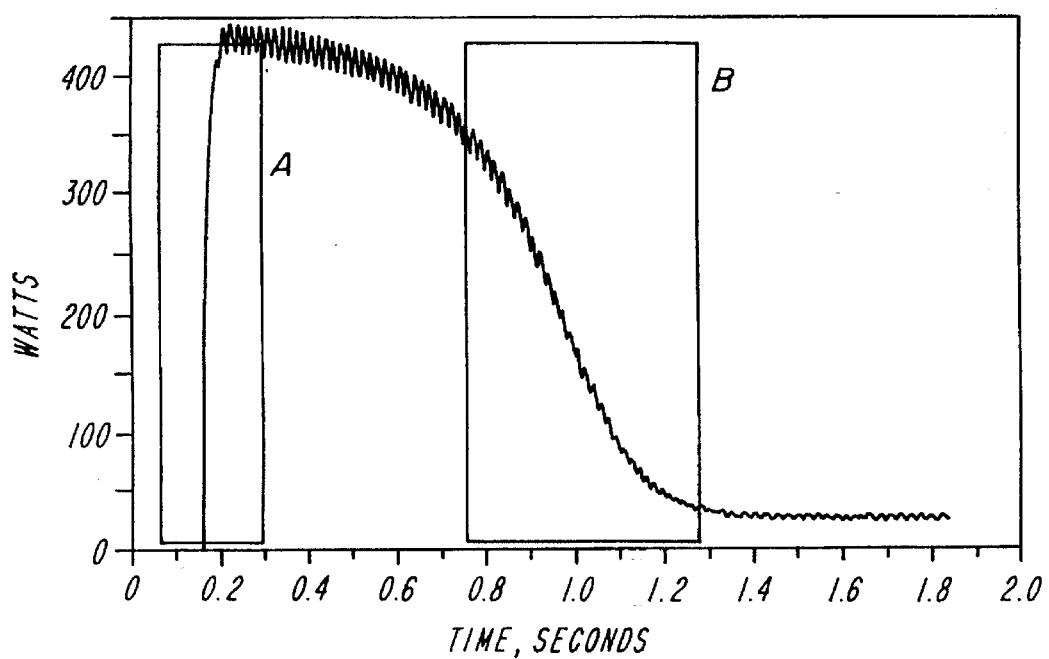
FIG. 5 shows the measured envelope of real power transients during turn-on for an induction motor.

A complete transient identification is be made by searching for a precise time pattern of v-sections. The v-sections are relatively narrow, and there is reason to expect that such sections will be less likely to be fatally corrupted than would an entire and lengthy transient. For illustrative purposes, consider the following example. FIGS. 4 and 5 respectively show the measured envelope of real power transients during turn-on for an instant start fluorescent lamp bank and an induction motor. The single v-section in the instant start pattern is marked with an ellipse A in FIG. 4, and the two v-sections in the motor pattern are marked with rectangles A and B in FIG. 5. It will be appreciated that a more complicated set which includes v-sections in other data streams such as reactive power can be used to represent the transient profile of a load, but are ignored for this illustrative example.

Figure 6:
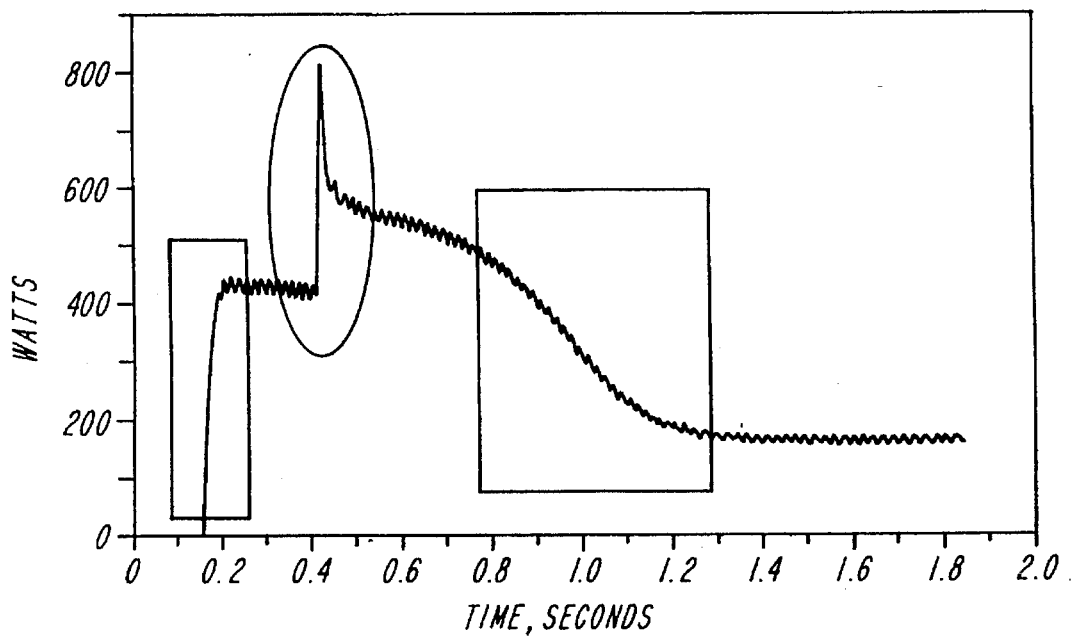
FIG. 6 shows an example of acceptable overlapping v-sections.
Figure 7:
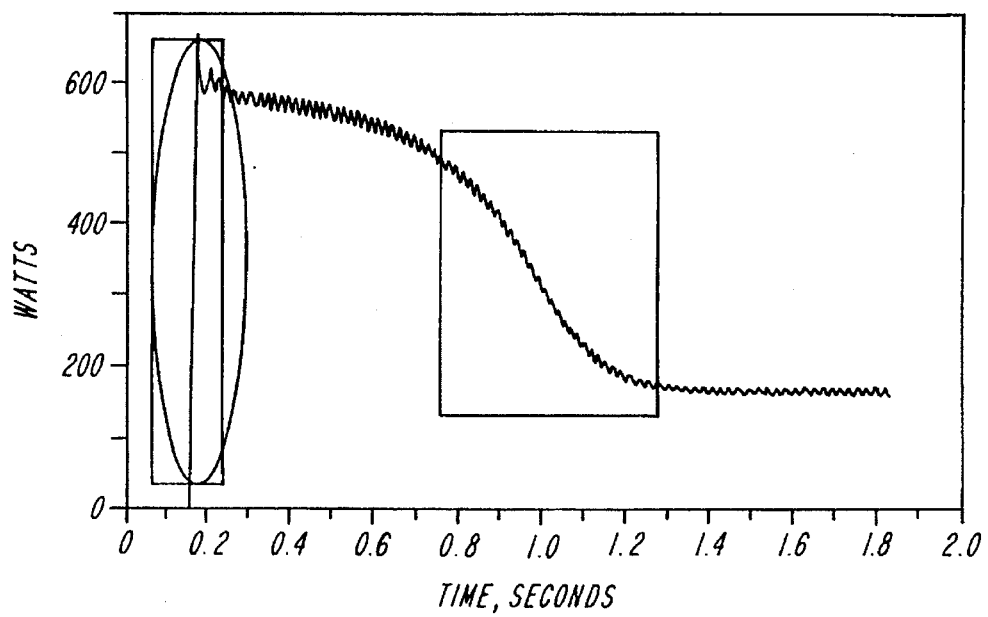
FIG. 7 shows an example of unacceptable overlapping v-sections.

As long as each of the v-section shapes is clearly distinguishable, the NILM is able to identify the patterns of v-sections and therefore the transients. For example, the overlap of the two transients shown in FIG. 6 is tractable because all of the v-sections for both transients are distinguishable. That is, each v-section overlaps additively with a region that is relatively featureless and quasi-static. The overlap condition in FIG. 7 would not generally be tractable, since the instant start v-section and the first induction motor v-section overlap severely.

Since some degree of overlap is tolerable, the v-section set recognition technique in accordance with the present invention will generally operate successfully in an environment with a higher rate of event generation than would a transient event detector searching for whole, undisturbed transient shapes. For transient identification to work reliably, the transient patterns need to be relatively unique and reasonably repeatable. This has two implications for the v-section search technique. First, it will be advantageous to search as many data streams as will provide useful information, i.e., interesting v-sections. Envelopes of real and reactive power, as well as higher harmonic content, should all be considered as possible sources of v-sections when developing prototype v-section templates for use in the NILM. Second, if the v-sections are not repeatable or informative, the pattern search will not be robust and efficient. For instance, v-sections whose shapes are extremely dependent on the turn-on time for the load should probably not be included in the prototype template for that load.

Classification of individual v-sections in the input data streams will be determined by the transient event detector 110 in accordance with the present invention with a set of discriminator functions. Discriminators partition the state space of all possible input data into regions or classes. The discriminator functions are used to compute a distance metric that locates a particular input vector in a region of a state space of known transient templates. Since a v-section may appear on top of a variably large static or quasi-static level created by the operation of other loads, the discrimination process focuses on only the "AC" or varying component of the v-section.

An exemplary pattern discriminator computes a distance metric between a vector of input data and a template vector. For example, the Euclidean metric computes the norm of the difference between two vectors. Another conventional discriminator that has been used for scene analysis and image recognition is the transversal filter. The impulse response of a transversal or matched filter is proportional to the time-reversed signal for which the filter is designed to search. In operation, the transversal filter computes the inner product of a vector of input data with a template vector. Because there are many highly efficient hardware solutions available for implementing a transversal filter, and because of its conceptual simplicity, the transversal filter is an attractive signal processing construct for performing pattern discrimination. For the event detector of the present invention, each v-section will be positively identified by checking the outputs of two transversal filters.

The first transversal filter scans an input data stream for a particular shape. Let t denote a vector of N samples of a v-section of interest, such as one of the v-sections marked in FIGS. 4 and 5. The vector t consists of elements:

$$t[i], i=0\ldots N-1 \tag{1}$$

An "AC coupled" and amplitude normalized version of the v-section, designated $t_{ac}$, can be computed as:
where the denominator is the 2-norm of the numerator. Thus, $t_{ac}$ is a unit length vector with zero mean. This shape transversal filter operates by sliding an N-point window across the input data stream. At any time, the window contains an AC-coupled and amplitude normalized vector of points $x_{ac}$ of an N-point section or vector x of the input data. The vector $x_{ac}$ is computed from the vector x using an equation structurally identical to Equation (2). The output of the shape transversal filter is the inner product of the template vector $t_{ac}$ and the data vector $x_{ac}$.

This output corresponds to the cosine of the angle between the two unit length vectors $t_{ac}$ and $x_{ac}$. An output of unity indicates a perfect match between the template vector and the input data. Naturally, noise and slight variation in the repeatability of the v-sections will make a perfect match unlikely. It will be appreciated that some degree of imperfection may be tolerated and any inner product within a certain match tolerance of unity, i.e., between unity and some positive number less than unity, can constitute a match. In geometric terms, the match tolerance has the effect of defining a hypercone around the template vector $t_{ac}$ in the pattern space, within which an input vector $x_{ac}$ may fall and still be considered a match.

When a segment in the input data stream is found that matches the shape of a template v-section, a second transversal filter is be employed to check the amplitude of the segment. This amplitude transversal filter computes the inner product of the template vector $t_{ac}$ and the input data vector x, rather than the inner product of $t_{ac}$ and $x_{ac}$. By itself, the amplitude transversal filter would not be a satisfactory pattern discriminator. Since its amplitude is not normalized, a vector x could be practically orthogonal to the template vector, but still yield a large inner product with the template. However, checking the amplitude is essential in conjunction with checking shape to ensure that a small wiggle or noise pattern that is fortuitously close in shape to a v-section template is not mistaken for an actual v-section.

Loads in a particular class which spans a wide power range often exhibit transient profiles that are identical in shape, but scaled in amplitude and duration. The transversal filter is suitable for identifying transient shapes over a narrowly defined time scale. The event detector in accordance with the present invention utilizes a tree-structured decomposition to search efficiently over many time scales with the transversal filters.

Figure 8:
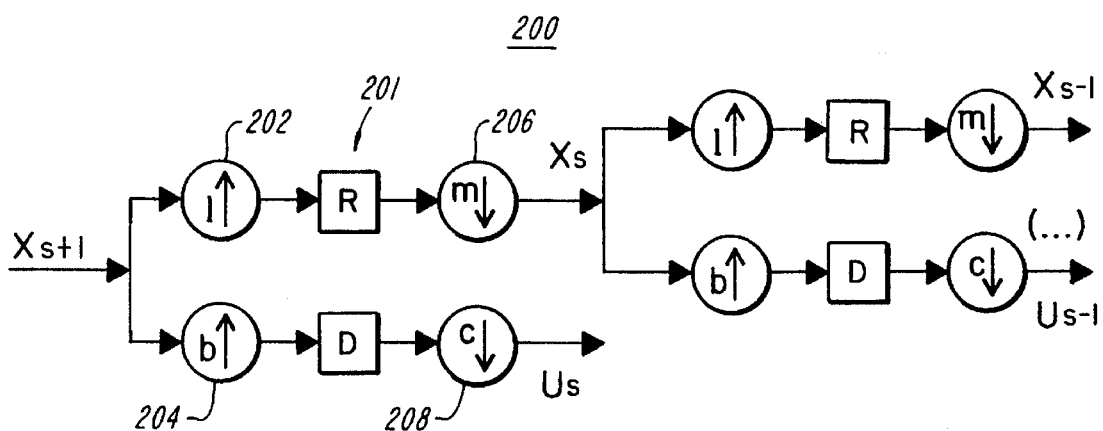
FIG. 8 shows a tree-structured decomposition in accordance with the present invention.

A tree-structured signal decomposition 200 is shown schematically in FIG. 8. An atomic section 201, or coder, of the tree shown would consist of the two upsamplers 202, 204 with respective upsampling rates of 1 and b, operations R and D, and the two trailing downsamplers with respective downsampling rates of m and c. The upsampling and downsampling operations in one section of the tree can alter the scale of the input signal (for example $X_{s+1}$ at the resolution step s+1) by fractional amounts m/1 and c/b. The scale alteration produces the output signals $X_s$ and $U_s$, respectively. If R and D were implemented as linear filters and b, c, 1, and m were adjusted to yield at output resolution step s a net increase in scale (a decrease in the number of points, i.e., m/1>1 and c/b>1), the atomic section would correspond to a single sub-band coder, generalized by the inclusion of arbitrary rational sample rate alteration. With linear filters and b=l=1 and c=m=2, the tree-structured organization of sub-band coders shown in FIG. 8 is referred to in the wavelet literature as Mallats's pyramidal or tree-structured wavelet decomposition, or the analysis component of the discrete wavelet transform (DWT).

The data at resolution step s+1 at the first stage of the tree is presumably the original, raw sampled data collected for a particular application. That is, the data stream $X_{s+1}$ is collected at a high enough sampling rate to adequately capture all of the frequency content present in the input data without aliasing. This lowest scale data contains information or signal detail at many different scales. Each upper path, or resolving path, in any particular sub-band coder in the tree alters the resolution of the input signal with operation R and also alters the scale of the input signal with the up/down-sampling operations at rates 1 and m. The lower, discriminating path typically implements a differencing or discriminating operation D that extracts scale specific information from the input data. In the case of a wavelet transform of an initial window of data $X_{s+1}$ containing $2^m$ input points and with b=l=1 and c=m=2, the tree-structured decomposition will produce output coefficients $U_i$ at M different scales or tree sections. In the wavelet transform, the operation R is preferably a low-pass filter that extracts a low resolution signal $X_s$ from the higher resolution input signal $X_{s+1}$. The operation D is preferably a high-pass filter that creates a detail signal that encodes the information or resolution that must be combined with $X_s$ to recover the input data.

In a pattern recognition application, operation D is preferably a pattern discriminator that detects the presence of a particular waveform shape, or v-section in the case of the transient event detector of the present invention. According to one aspect, D may be a linear operation such as a transversal matched filter which computes the discriminating coefficients, for example, that indicate the possible presence of a v-section. Accordingly, R may be implemented with a linear filter for the v-sections associated with many commercial and industrial loads.

With reference now to FIG. 9, the analog preprocessor 300 is illustrated with four channels of analog monitoring circuitry for only a single phase. These four channels compute estimates of the envelopes of real power, reactive power, in-phase third harmonic content in the current waveform, and quadrature third harmonic content in the current. It will be appreciated that two additional sets of this circuitry are required for monitoring the voltage and current on the other two legs of the three phase service.

The variables v(t) and i(t) in FIG. 9 represent analog signals that are scaled and isolated versions of the actual voltage and current waveforms in a particular phase. These scaled and isolated waveforms are produced by Hall-effect voltage and current sensors. The voltage is approximately a sinusoid at 60 Hertz line frequency, and is arbitrarily assumed to be a cosine wave, as shown in FIG. 9. The assumptions about frequency and phase are for illustrative convenience and do not impact on the generality of the techniques presented herein. Looking across the top of the figure, the first channel in the analog preprocessor 300 computes an estimate of the envelope of real power. A multiplier 306 computes the instantaneous product of voltage and current, i.e., instantaneous power. The waveform of instantaneous power is filtered by a second order Butterworth low-pass filter 308 with a cutoff frequency of 20 Hertz. This filter rejects the "carrier wave" 120 Hertz fundamental component of instantaneous power; i.e., it computes an approximate time average of the instantaneous power, or real power, represented by the variable P. It also serves as an anti-aliasing filter so that the waveform P may be sampled accurately by the DSP.

The second channel in the analog preprocessor computes an estimate of the envelope of reactive power. A sinusoid that lags the voltage waveform by 90 degrees is generated by integrating the voltage waveform. This quadrature sine wave is mixed with the current and low-pass filtered to compute Q, the estimate of reactive power. The third and fourth channels compute estimates of the third harmonic content in the current waveform. A phase-locked loop circuit 310 locks to the line frequency of the voltage waveform and generates a cosine wave at 180 Hertz, three times the frequency of the voltage waveform. This tripled frequency cosine is again mixed with the current waveform and the result is low-pass filtered to generate an envelope of the third harmonic content in phase with the voltage waveform. The envelope is labeled P3, where quotation marks have been included to emphasize that this envelope is not actually a variable of power in any conventional sense. Finally, the fourth channel integrates the 180 Hertz cosine wave to generate a 180 Hertz sine wave. This high frequency sine wave is mixed with the current and the product is low-pass filtered to generate an envelope of quadrature third harmonic content in the current, labeled Q3.

It will be appreciated the described techniques of integrating to generate quadrature waveforms and employing phase-locked loops to generate higher harmonics could be applied to compute envelopes of harmonic content for any frequency of interest, not just third harmonic. It is generally advantageous to have as many informative channels of input data as possible, since this tends to increase the diversity of the v-section sets associated with different load classes. Third harmonic is a well-known component in the current waveforms of many loads. For example, computers containing power supplies that rectify the line voltage without power factor or harmonic content correction generate third harmonic currents. Hence, third harmonic was chosen as the example for the analog preprocessor for illustrative purposes. Other harmonics will be useful for identifying other load types.

Figure 10:
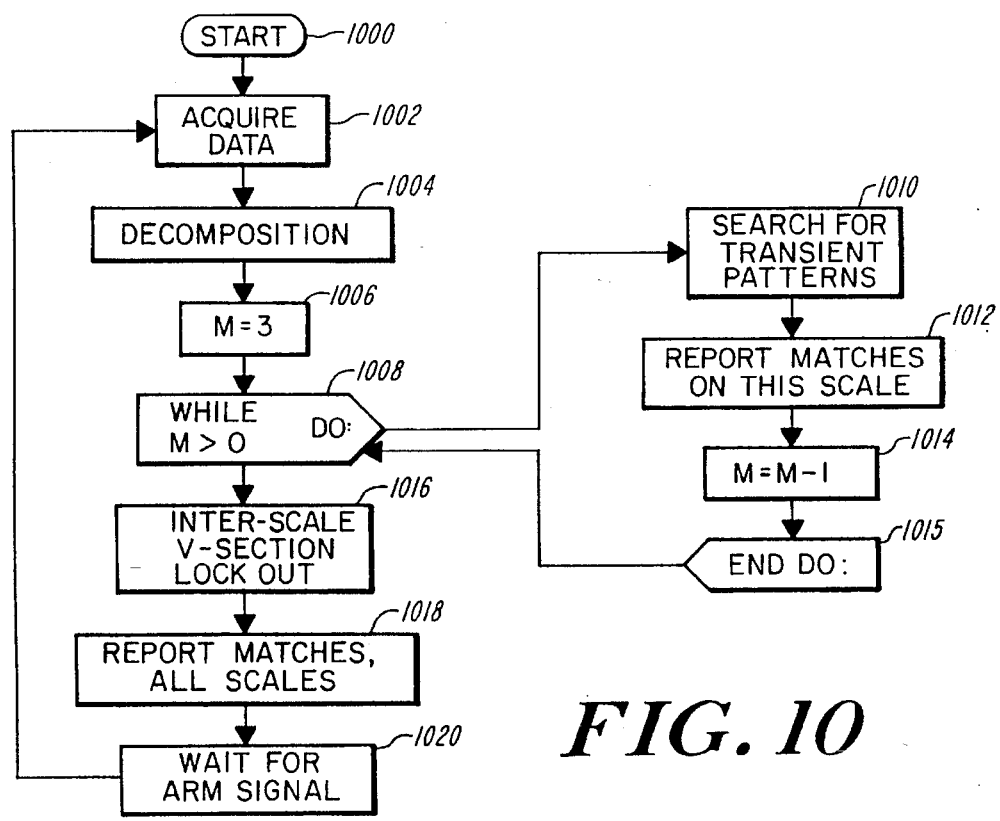
FIG. 10 shows a flow chart of the complete event detection algorithm carried out by the multiscale transient event detector in accordance with the present invention.

FIG. 10 shows a flow chart of the complete event detection algorithm carried out by the multiscale transient event detector in accordance with the present invention. This flow chart describes the analysis procedure conducted, for example, after the event detector has acquired a window of samples from the input data streams. In the exemplary embodiment, a window contains 330 sample points, or approximately 1.83 seconds of data. For convenience in the presentation and analysis of results, the exemplary embodiment operates much like a digital storage oscilloscope. The event detector samples the input data streams while waiting for a triggering event to occur on one of the channels. This event is any change in value between successive points that is greater than a user-specified value. When a triggering event is observed, the event detector saves a window of data for analysis with the event detection algorithm.

With sufficient memory, the event detector can execute the event recognition algorithm without halting its sampling, so that the search for events is conducted continuously. FIG. 10 summarizes the sequence of actions taken by the event detector after the user has initialized the process as indicated by the START bubble in the flow chart (step 1000).

During a data acquisition step (step 1002), the event detector collects a window of samples which will be searched for known transient patterns. Once a full window or vector of samples has been acquired, the event detector performs a tree-structured decomposition (step 1004) on the data as described with respect to FIG. 8. In the exemplary embodiment, the input data for each coder step in the tree is computed before any pattern discrimination occurs at any scale step. The decomposition is conducted with sample rate changes of 2 to 1. Next, the event detector searches at each scale for all of the transient types that could appear (step 1006). There are three scale steps, and a scale step variable M is initialized to the value of 3 to count down the search. Initially, when M=3, the finest scale step, which corresponds to the initial vector of 330 sample points, will be searched for transient patterns. Thereafter, the middle and coarse scales will be searched when M=2 and M=1, respectively.

A loop in the program flow at this point (step 1008) controls the search for patterns over all three scale steps. At step 1010, a hierarchical pattern search with v-section lock out on scale M is initiated. During each pass through the pattern search loop, the event detector searches for the v-sections associated with all of the known transient events developed during training. Each iteration of the loop focuses on a single scale. The first pass through the loop, when M=3, corresponds to a search on the finest scale. The pattern search is hierarchical, in that the event detector searches for the most complex transient patterns first. When all of the v-sections for a pattern are found with both the shape and amplitude transversal filtering operations, the complete transient pattern is presumed to be present in the input data, and an event is recorded.

A v-section lock out, as previously described with reference to FIGS. 2–7, is performed at each scale. If a complex pattern is found in the input data, the location of the v-sections of the pattern are recorded. The identification of any subsequent, less complex patterns will not be permitted based on the detection of v-sections at the previously recorded, "locked out" locations. The rationale for this lock out stems from the assumption that v-sections should not overlap. If a very complicated v-section set associated with a certain pattern is found in the data, the likelihood that the transient associated with this pattern is actually present in the data is relatively high. If a less complicated pattern is subsequently matched based on one or more v-sections that overlap with v-section locations of a previously discovered, more complicated pattern, the match for the less complicated pattern is presumed to be erroneous.

If all of the v-sections are found for a particular pattern, the transient pattern is presumed to be present in the data at the current scale M, and an event type and time is recorded (step 1012). The scale counter M is decremented (step 1014), and the pattern detection loop is repeated until all remaining coarser scales have been searched for all pattern types. Thereafter, the loop is ended (step 1015).

The event detector next performs an inter-scale v-section lock out as a final check of all matches found on all scales (step 1016). The event detector has already performed a hierarchical pattern search on each scale. This final check ensures that v-sections from a complex but coarse scale pattern were not used to match a less complicated, finer scale pattern. The event detector then collates a final report of the type and time of occurrence of all positive event detections (step 1018). This report is recorded on a mass storage device and also to a graphical user interface for review by the operator.

After reporting any events, the event detector waits for the operator to issue an arming command. Once the system has been armed, the process flow returns to the data acquisition step (step 1002).

With reference now to FIGS. 11–15, exemplary output display screens for the multiscale transient event detector of the present invention are shown. For illustrative purposes, four electrical loads are represented as being monitored by the exemplary event detector: a bank of instant start fluorescent lamps, a bank of rapid start fluorescent lamps, a ¼ horsepower induction motor, and a ⅓ horsepower induction motor. The transient pattern templates for the loads are captured during a one-time training period. However, no data is collected from the large motor. Because the large and small induction motors are members of the same load class, a single transient template, appropriately scaled in amplitude and duration, is satisfactory for identifying both motors.

The graph windows in each of FIGS. 11–15 show estimates of the envelopes of real and reactive power on one phase of the three phase service. For example, the windows of FIG. 11 display the data collected during the turn-on of the instant start lamp bank. In the lower left-hand corner of each screen display, any transient events that the event detector has been able to identify appear under the heading "Contacts". Events or contacts are reported by identity, time of occurrence, and scale. There are three scales listed in the contact window: fine, mid, and coarse. Any event that was identified by a known v-section set at the initial, highest sampling rate, i.e., at the first coder stage in the tree-structured decomposition, is listed directly under the heading "Fine Scale" in the contact window. Events found at the next two coder stages in the tree-structured decomposition are listed under the headings "Mid Scale" or "Coarse Scale".

Figure 11:
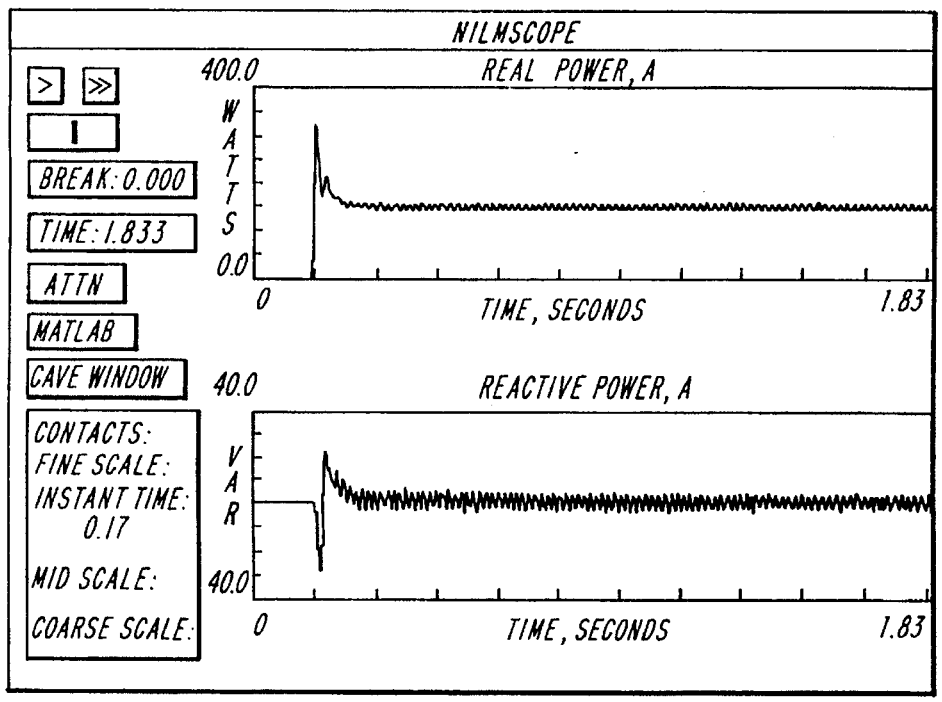
FIGS. 11, 12, 13, 14 and 15 show exemplary output display screens for the multiscale transient event detector of the present invention.
Figure 12:
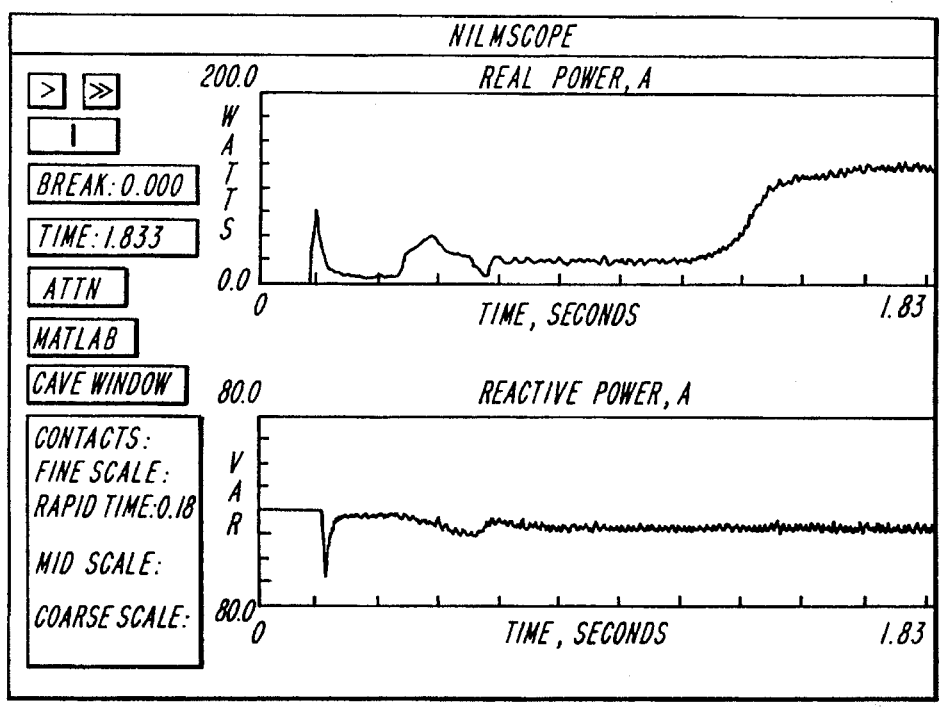
Figure 13:
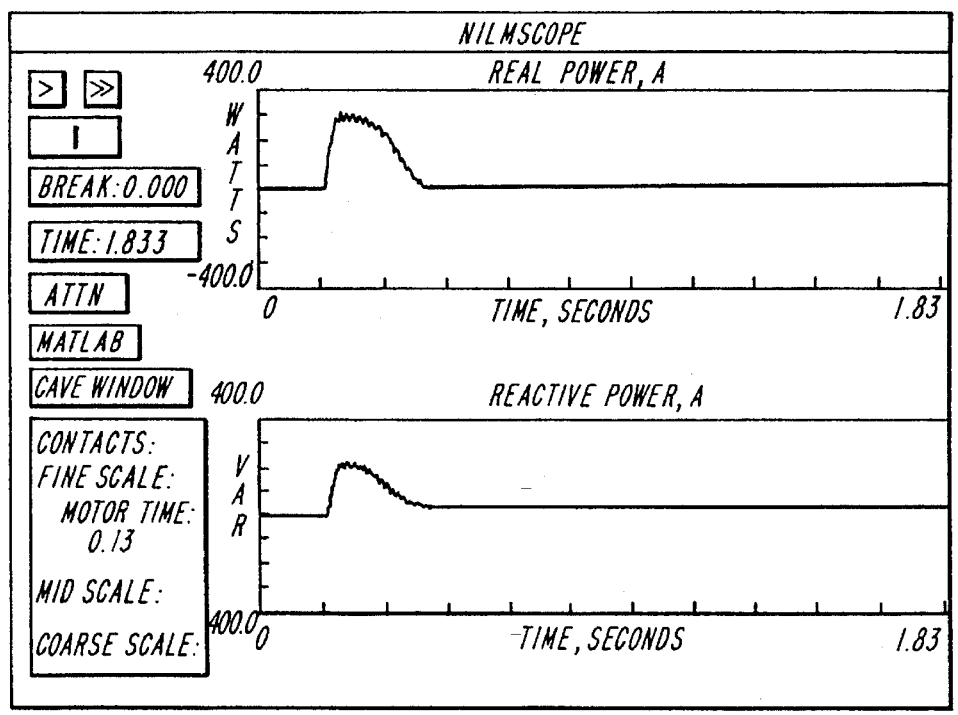
Figure 14:
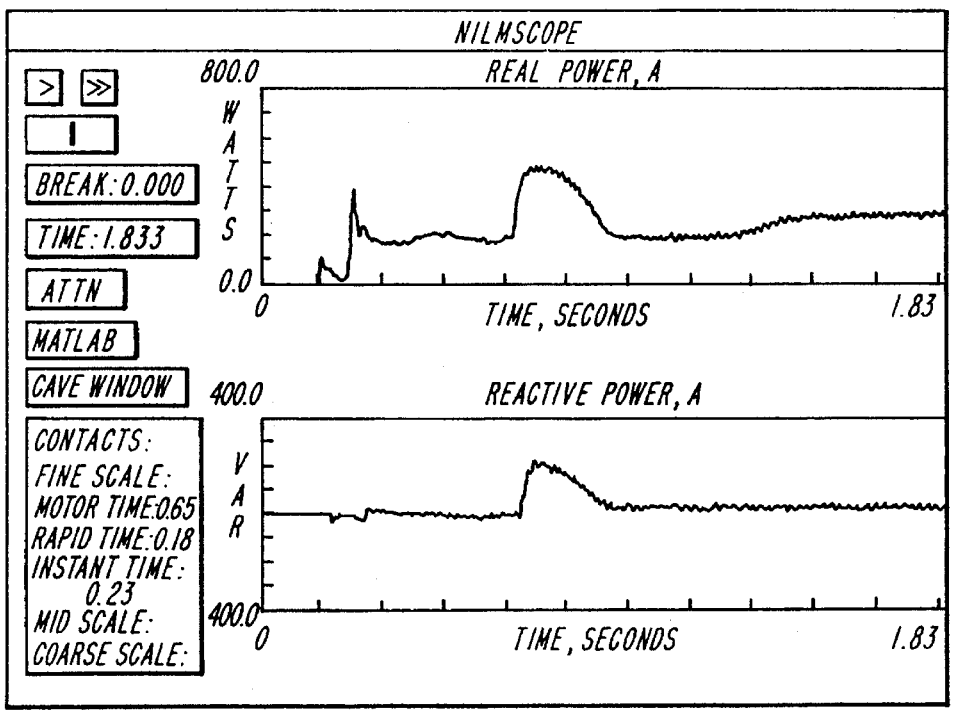
Figure 15:
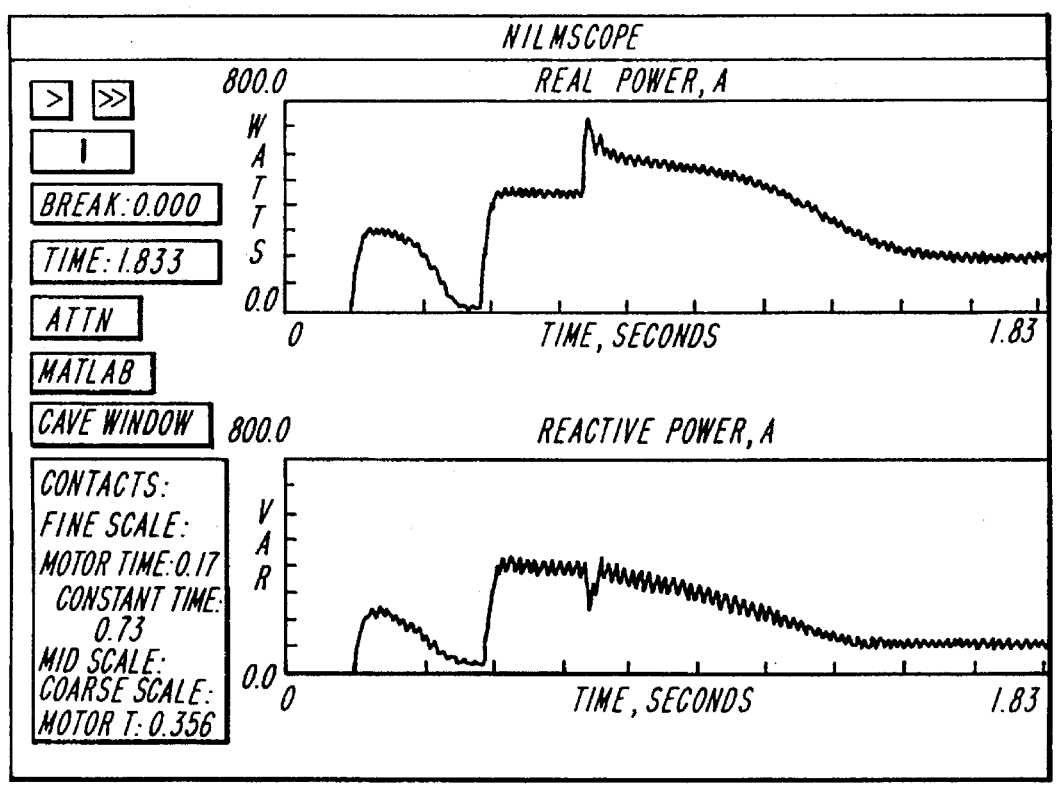

The displays of FIGS. 11–13 record the performance of the event detector when challenged individually with the turn-on events of the instant and rapid start lamp banks and the small induction motor, respectively. In each case, the observed event is properly identified in the contact window. The display screen of FIG. 14 shows an example where both lamp banks and the small motor turn on so that all three transient events overlap. All three events are correctly recorded at the finest time scale in the contact window. In the final screen display of FIG. 15, the small induction motor turns on and completes its transient, followed by the turn-on transient of the large induction motor and the instant start lamp bank. The events are appropriately recorded.

The robustness of the multiscale transient event detector in accordance with the present invention can be enhanced by working with more complicated v-section pattern sets for each load. For example, including the reactive power v-section for the instant start bank would tend to eliminate false matches. Variation could be handled by working with more than one transversal filter template for this particular v-section. A match from any candidate v-section shape over the range of possible shapes would constitute a match for the v-section in the reactive power data stream. Searching more data streams, such as the third harmonic streams already generated by the analog preprocessor, would result, in general, in more complicated v-section pattern sets for many loads of interest. Employing more complicated sets of interesting v-sections for each significant load will tend to enhance the reliability of the event detection algorithm.

Searching for more v-sections, motivated by the desire for more complicated patterns for each significant load, or the desire to monitor more loads, or both, requires more computational capability. The DSP used in the exemplary embodiment was selected precisely for its high numerical performance and flexible development tools. It is not necessarily the most cost effective solution, however. Fortunately, the pattern search loop in the event detection algorithm, represented by the steps 1008–1014 of FIG. 10, can be conducted in parallel. Accordingly, the search for each v-section could be conducted independently by a relatively low cost processor. Furthermore, the search for each v-section on each scale could also be conducted independently. This strongly suggests that a commercial NILM based on the event detector and algorithm of the present invention could be based on a parallel processing architecture composed of inexpensive microprocessors or microcontrollers. The performance of the event detector in such a NILM would always be easily expandable for more challenging monitoring sites by simply adding more processors to search for more v-sections, and possibly over more time scales.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

We claim:

1. A transient event detector for use in a nonintrusive electrical load monitoring system at a monitored site having at least one electrical load, said detector comprising:

data acquisition means for acquiring and storing start-up power transient pattern data associated with each electrical load being monitored, said power transient data corresponding to approximate envelopes of harmonic content of observed current or voltage waveforms produced by said at least one electrical load;

monitoring means for continuously monitoring total power load pattern data at said site, said total power load pattern data corresponding to an aggregation of said envelopes of harmonic content; and processing means for corresponding time varying sections of said transient pattern data to time varying sections of said total power load pattern data in order to identify each electrical load.

2. The detector of claim 1, wherein said transient pattern data comprises predetermined time segments having significant variations in power.

3. The detector of claim 1, wherein said data acquisition means comprises means for deriving said transient pattern data from the instantaneous voltage and current utilized at said site.

4. The detector of claim 3, wherein said transient pattern data corresponds to real power.

5. The detector of claim 3, wherein said transient pattern data corresponds to reactive power.

6. The detector of claim 3, wherein said transient pattern data corresponds to frequency harmonics associated with said instantaneous current.

7. The detector of claim 1, wherein said data acquisition means comprises means for distinguishing between types of electrical loads.

8. The detector of claim 7, wherein said data acquisition means further comprises means for scaling said transient pattern data to correspond to power variations within a distinguished type of electrical load.

9. The detector of claim 8, wherein said power variations are due to fluctuations in power supplied to said site.

10. The detector of claim 8, wherein said power variations are due to differing amplitude and duration power requirements of distinct loads within a distinguished type of electrical load.

11. The detector of claim 1, wherein said processing means comprises means for determining the occurrence of a match of said transient pattern data with a time segmented pattern of said total power load pattern data.

12. The detector of claim 11, wherein said determining means is operable for performing a hierarchical pattern search such that the transient pattern data with the greatest number of time varying sections of envelopes of harmonic content having significant variations in amplitude are initially searched.

13. The detector of claim 11 further comprising event indication means for providing an indication of the start-up of each identified electrical load in response to said determining means determining the occurrence of a pattern match.

14. The detector of claim 13, wherein said event indication means further provides an indication of the time and type of electrical load identified.

15. A method of transient event detection in a nonintrusive electrical load monitoring system at a monitored site having at least one electrical load, said method comprising the steps of:

acquiring and storing operational start-up power transient pattern data associated with each electrical load being monitored, said power transient data corresponding to approximate envelopes of harmonic content of observed current or voltage waveforms produced by said at least one electrical load;

monitoring total power load pattern data at said site, said total power load pattern data corresponding to an aggregation of said envelopes of harmonic content;

correlating time varying sections of said transient pattern data to time varying sections of said total power load pattern data; and identifying each electrical load which is being operated at said site.

16. The method of claim 15, wherein said transient pattern data comprises predetermined time segments having significant variations in power.

17. The method of claim 15, wherein said data acquisition means comprises means for deriving said transient pattern data from the instantaneous voltage and current utilized at said site.

18. The method of claim 15, wherein said transient pattern data corresponds to real power.

19. The method of claim 18, wherein said transient pattern data further corresponds to reactive power.

20. The method of claim 15, wherein said transient pattern data corresponds to frequency harmonics associated with said instantaneous current.

21. The method of claim 15, wherein said data acquisition step further comprises the step of distinguishing between types of electrical loads.

22. The method of claim 21, wherein said data acquisition step further comprises the step of scaling said transient pattern data to correspond to power variations within a distinguished type of electrical load.

23. The method of claim 22, wherein said power variations are due to fluctuations in power supplied to said site.

24. The method of claim 22, wherein said power variations are due to differing amplitude and duration power requirements of distinct loads within a distinguished type of electrical load.

25. The method of claim 15, wherein said correlating step further comprises the step of determining the occurrence of a match of said transient pattern data with a time segmented pattern of said total power load pattern data.

26. The method of claim 25 further comprising the step of performing a hierarchical pattern search such that the transient pattern data with the greatest number of time varying sections of envelopes of harmonic content having significant variations in amplitude are initially searched.

27. The method of claim 25 further comprising the step of providing an indication of the start-up of each identified electrical load in response to determining the occurrence of a pattern match.

28. The method of claim 27, wherein said indication step further comprises the step of providing an indication of the time and type of electrical load identified.

29. The detector of claim 8, wherein said scaling means scales said transient pattern data in amplitude and duration.

30. The method of claim 22, wherein said step of scaling comprises scaling said transient pattern data in amplitude and duration.

31. The detector of claim 1, wherein said data acquisition means further comprises means for mixing said observed current or voltage waveforms with a predetermined set of waveforms in order to demodulate said envelopes of harmonic content.

32. The detector of claim 31, wherein said data acquisition means further comprises a low-pass filter to extract variations in amplitude of each demodulated envelope of harmonic content.

33. The method of claim 15, wherein said step of acquiring and storing further comprises the step of mixing said observed current or voltage waveforms with a predetermined set of waveforms in order to demodulate said envelopes of harmonic content.

34. The detector of claim 33, wherein said step of acquiring and storing further comprises the step of low-pass filtering to extract variations in amplitude of each demodulated envelope of harmonic content.

\* \* \* \* \*